United States Patent
Kwak

(10) Patent No.: US 8,040,726 B2
(45) Date of Patent: Oct. 18, 2011

(54) FLASH MEMORY DEVICE AND LAYOUT METHOD OF THE FLASH MEMORY DEVICE

(75) Inventor: Pan-suk Kwak, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 294 days.

(21) Appl. No.: 12/506,357

(22) Filed: Jul. 21, 2009

(65) Prior Publication Data

US 2010/0128530 A1    May 27, 2010

(30) Foreign Application Priority Data

Nov. 27, 2008   (KR) .................. 10-2008-0118807

(51) Int. Cl.
  *G11C 11/34*    (2006.01)
  *G11C 16/04*    (2006.01)
(52) U.S. Cl. ......... 365/185.05; 365/185.18; 365/185.26; 365/185.29
(58) Field of Classification Search ............. 365/185.05, 365/185.18, 185.26, 185.29
See application file for complete search history.

(56) References Cited

U.S. PATENT DOCUMENTS

| | | | | |
|---|---|---|---|---|
| 6,914,813 B2 * | 7/2005 | Chevallier et al. | ........ | 365/185.05 |
| 7,787,301 B2 * | 8/2010 | Lee et al. | ................. | 365/185.17 |
| 7,804,716 B2 * | 9/2010 | Kwak et al. | ................ | 365/185.2 |

FOREIGN PATENT DOCUMENTS

| | | | |
|---|---|---|---|
| KR | 1020050052808 A | | 6/2005 |
| KR | 1020060126165 A | | 12/2006 |
| KR | 100694972 B1 | | 3/2007 |

* cited by examiner

*Primary Examiner* — Anh Phung
*Assistant Examiner* — Toan Le
(74) *Attorney, Agent, or Firm* — Volentine & Whitt, PLLC

(57) ABSTRACT

Provided is a flash memory device including a plurality of page buffer high voltage transistors. The plurality of high voltage transistors are operatively associated with a page buffer circuit, wherein each high voltage transistor includes; a gate pattern separating a first pattern from a second pattern. The first and second patterns extend in parallel and serve as respective source/drain regions, and the first pattern is floated and the second pattern receives an erase voltage during an erase operation. A first set of high voltage transistors is series connected in a columnar arrangement, such that column adjacent high voltage transistors are laid out with alternating source/drain symmetry in the columnar direction.

12 Claims, 4 Drawing Sheets

FLASH MEMORY DEVICE AND LAYOUT METHOD OF THE FLASH MEMORY DEVICE

CROSS-REFERENCE TO RELATED APPLICATIONS

This application claims the benefit of Korean Patent Application No. 10-2008-0118807 filed on Nov. 27, 2008, the subject matter of which is hereby incorporated by reference.

BACKGROUND

The inventive concept relates to flash memory devices and layout methods for flash memory devices. More particularly, the inventive concept relates to flash memory devices and layout methods that reduce a spacing interval between high voltage transistors in a page buffer circuit.

Electrically erasable and programmable non-volatile memory devices are able to retain stored data in the absence of applied power. Flash memory is a commercially significant type of non-volatile memory finding contemporary application in a number of different product classes, particularly portable electronic devices.

SUMMARY

According to an aspect of the inventive concept, there is provided a flash memory device including a plurality of page buffer high voltage transistors. The plurality of high voltage transistors are operatively associated with a page buffer circuit, wherein each high voltage transistor comprises; a gate pattern separating a first pattern from a second pattern, wherein the first and second patterns extend in parallel and serve as respective source/drain regions, and the first pattern is floated and the second pattern receives an erase voltage during an erase operation. A first set of high voltage transistors is series connected in a columnar arrangement, such that column adjacent high voltage transistors are laid out with alternating source/drain symmetry in the columnar direction.

In another aspect of the inventive concept, there is provided a layout method for a flash memory device. The method includes: defining a plurality of high voltage transistors operatively associated with a page buffer circuit, wherein each high voltage transistor comprises; a gate pattern separating a first pattern from a second pattern, wherein the first and second patterns extend in parallel and serve as respective source/drain regions, defining a series connected first set of high voltage transistors in a columnar arrangement, such that column adjacent high voltage transistors are laid out with alternating source/drain symmetry in the columnar direction, and defining voltage line connections to the first set of high voltage transistors, such that during an erase operation each respective first pattern is floated and each respective second pattern receives an erase voltage.

BRIEF DESCRIPTION OF THE DRAWINGS

Exemplary embodiments of the inventive concept will be more clearly understood from the following detailed description taken in conjunction with the accompanying drawings in which.

DESCRIPTION OF EMBODIMENTS

Figure 1:
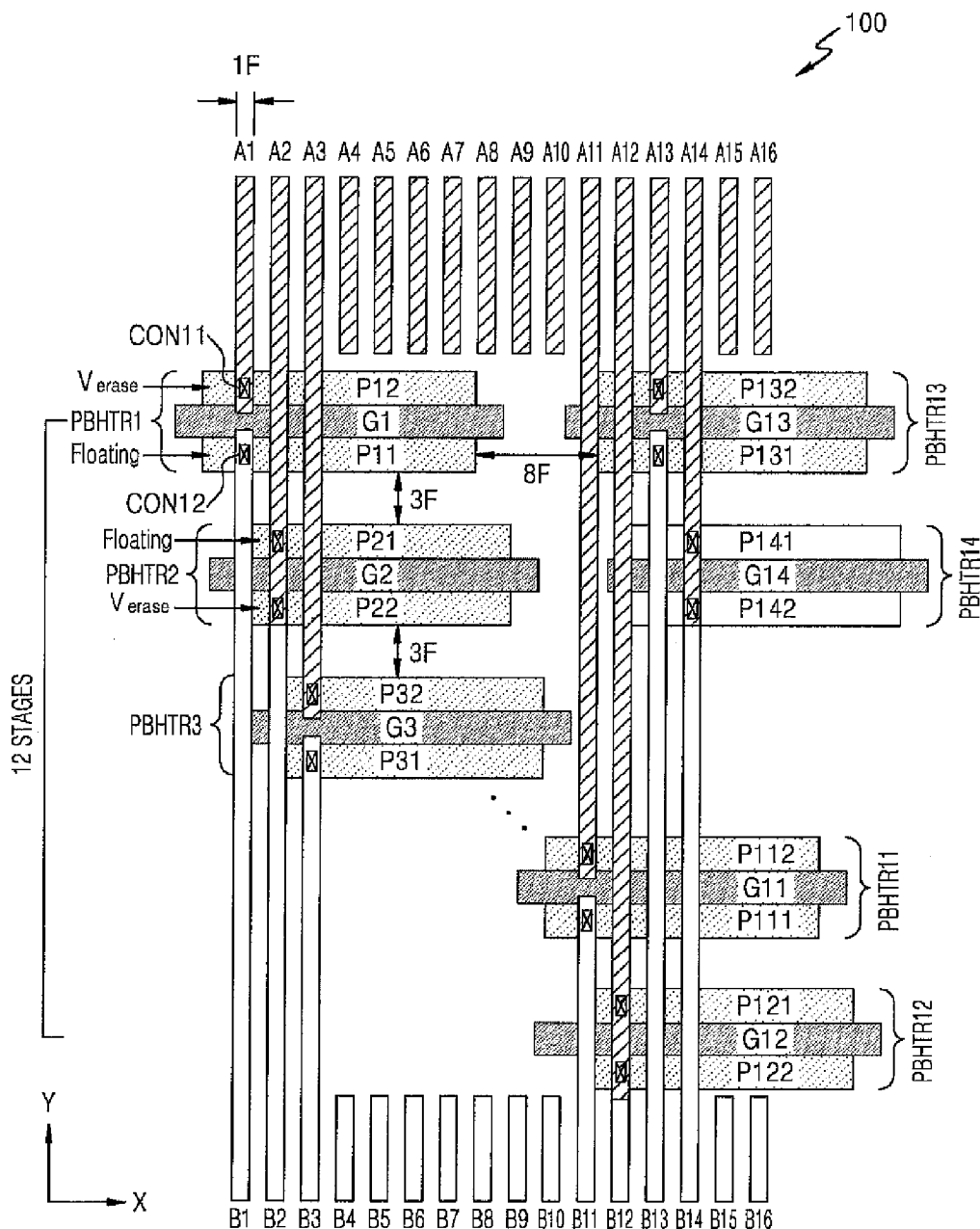
FIG. 1 is a diagram illustrating an exemplary layout for a flash memory device according to an embodiment of the inventive concept.

The attached drawings for illustrating exemplary embodiments of the inventive concept are referred to in order to gain a sufficient understanding of the inventive concept, the merits thereof, and the objectives accomplished by the implementation of the inventive concept. Hereinafter, embodiments of the inventive concept will be described in some additional detail with reference to the attached drawings. Throughout the written description and drawings, like reference numerals and labels are used to denote like or similar elements and features.

Figure (FIG.) 1 is a diagram illustrating an exemplary layout for a flash memory device 100 according to an embodiment of the inventive concept.

Referring to FIG. 1, the flash memory device 100 includes a plurality of page buffer high voltage transistors PBHTR1 through PBHTRN, wherein PBHTR1 through PBHTR3, PBHTR11, PBHTR12, PBHTR13, and PBHTR14 are selectively illustrated in FIG. 1, being conceptually representative of the plurality of "N" high voltage transistors associated with a number of page buffer circuits in a flash memory device. Those skilled in the art will recognize that any reasonable number of page buffers and/or high voltage transistors might be used in a particular flash memory design.

In FIG. 1, a first page buffer high voltage transistor PBHTR1 includes a gate pattern G1 separating a first pattern P11, and a second pattern P12. The first pattern P11 and second pattern P12 serve as source/drain regions for the high voltage transistor. When an erase operation is performed within the exemplary flash memory device of FIG. 1, it is assumed for purposes of illustration that the first pattern P11 is electrically floated, and an erase voltage (Verase) is applied to the second pattern P12. The erase voltage Verase may be about 20V but a voltage level is not limited thereto.

In the illustrated embodiment, the first through twelfth page buffer high voltage transistors PBHTR1~PBHTR12 are sequentially and adjacently disposed in a column or Y direction. Thus, as can be seen from FIG. 1, the first pattern P11 of the first page buffer high voltage transistor PBHTR1 is disposed "column adjacent to" and in parallel with a first pattern P21 of the second page buffer high voltage transistor PBHTR2. That is, the first patterns P11 and P21, both of which are floated during an erase operation, are adjacently disposed. In similar manner, a second pattern P22 of the second page buffer high voltage transistor PBHTR2 is disposed column adjacent to and in parallel with a second pattern P32 of the third page buffer high voltage transistor PBHTR3. That is, the second patterns P22 and P32 both receiving the erase voltage (Verase) during the erase operation are disposed column adjacent to each other. With this type of layout, the flash memory device 100 according to an embodiment of the inventive concept, the respective source/drain patterns for column adjacent high voltage transistors each receive the same bias voltage during an erase operation. Stated in other terms, column adjacent high voltage transistors in a flash memory page buffer may be laid out with alternating source/drain symmetry in the columnar (or Y) direction.

Figure 2:
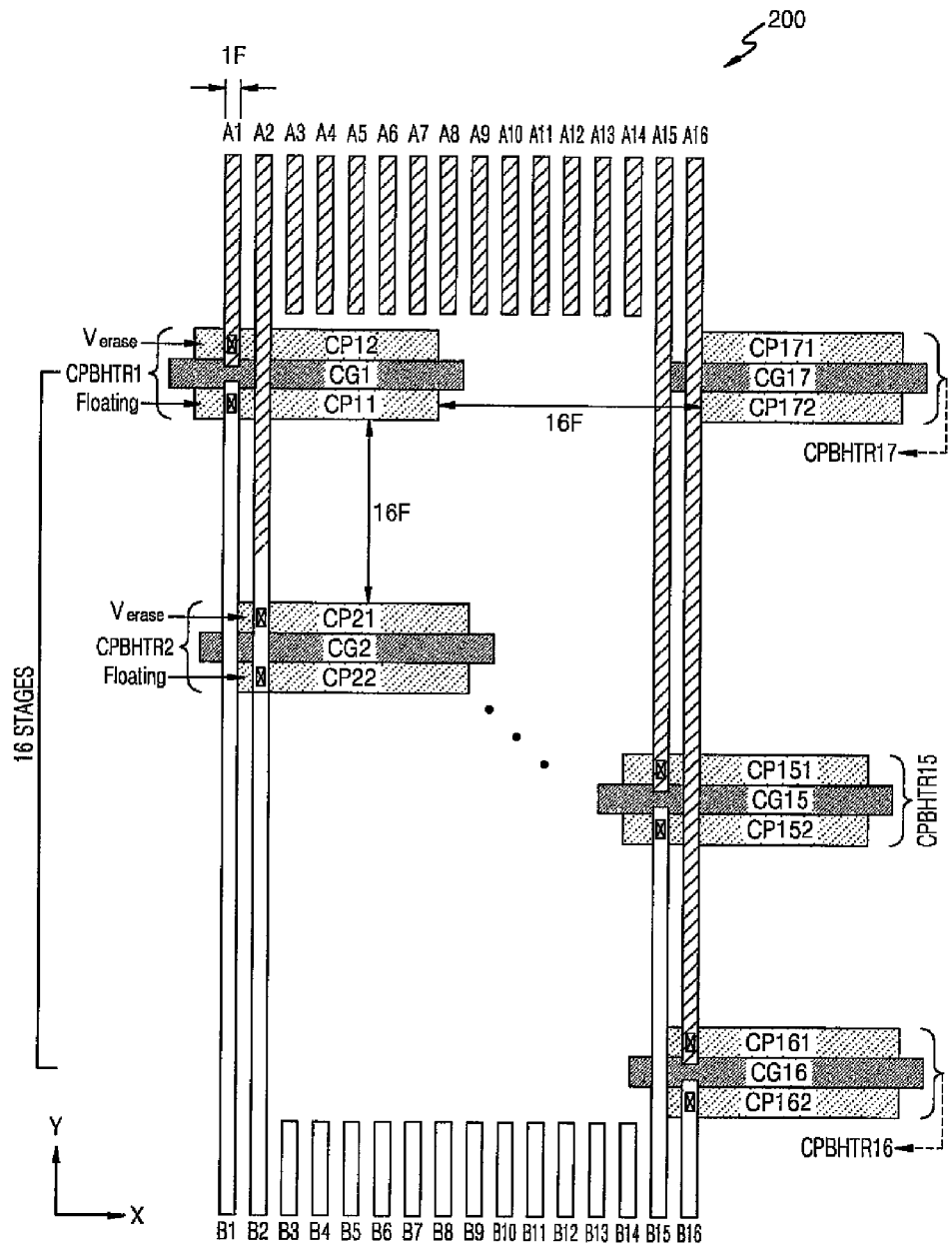
FIG. 2 is a diagram illustrating the layout of a conventional flash memory device flash memory device by way of comparison with the layout of FIG. 1.

By way of comparison, FIG. 2 is a diagram illustrating a layout for a conventional flash memory device 200.

Referring to FIG. 2, during an erase operation, alternating bias voltages are applied to the facing patterns of column adjacent high voltage transistors (e.g., a pattern CP11 and a pattern CP21). Thus, during an erase operation, the pattern CP11 is floated and an erase voltage (Verase) is applied to the pattern CP21. Because of the large voltage difference between these two column patterns, each respectively associated with a different, high voltage transistor, a relatively large spacing interval (e.g., 16F, where "F" is a defined as a minimum or standard feature size, such as (e.g.,) a line width) must be maintained between the column adjacent high voltage transistors.

In contrast, in the flash memory device 100 according to an embodiment of the inventive concept, column adjacent source/drain patterns from adjacent high voltage transistors receive the same bias voltage. Accordingly, the layout spacing between these two column adjacent high voltage transistors in a page buffer may be reduced to (e.g.,) 3F. Those skilled in the art will recognize that the 16F to 3F comparison is merely an example, but spacing interval reductions of at one-half may be achieved using the layout concept proposed by the inventive concept.

Referring back to FIG. 1, the flash memory device 100 further includes a plurality of first voltage lines A1~A16 and a plurality of second voltage lines B1~B16. The first voltage lines A1~A16 and the second voltage lines B1~B16 may be formed at different material layers within the flash memory device. For example, the first voltage lines A1~A16 may be formed at a metal-1 layer (not shown) and the second voltage lines B1~B16 may be formed at a metal-0 layer (not shown).

The first voltage lines A1~A16 and the second voltage lines B1~B16 may be connected to and supply various voltages such as the erase voltage (Verase) to the first patterns P11~P141 or the second patterns P12~P142 of the page buffer high voltage transistors PBHTR1~PBHTR14. The first voltage lines A1~A16 and the second voltage lines B1~B16 may also be connected to float the first patterns P11~P141 or the second patterns P12~P142 of the page buffer high voltage transistors PBHTR1~PBHTR14. For example, the first voltage lines A1~A16 may supply the erase voltage (Verase) to the first patterns P11~P141, and the second voltage lines B1~B16 may float the second patterns P12~P142.

A first first voltage line A1 and a first second voltage line B1 are respectively connected to the first pattern P11 and the second pattern P12 of the first page buffer high voltage transistor PBHTR1. In the illustrated embodiment, the first first voltage line A1 supplies the erase voltage (Verase) to the first pattern P11, and the first second voltage line B1 floats the second pattern P12. In similar manner, a second first voltage line A2 and the second second voltage line B2 are respectively connected to the first pattern P21 and the second pattern P22 of the second page buffer high voltage transistor PBHTR2, etc.

Referring to FIG. 1, each "ith" first voltage line Ai and ith second voltage line physically overlap one another, albeit in different material planes within the flash memory device, where "I" varies from 1 to M for the pluralities of first and second voltage lines. (Those skilled in the art will inferentially recognize this relationship from the plane view provided by FIG. 1). However, this ith voltage lines overlap may be replaced in certain embodiments of the inventive concept with a non-overlapping relationship, such as one provided by non-linear voltage lines.

However, in the illustrated example of FIG. 1, the overlapping ith voltage lines respectively connected to the first patterns P11~P141 or the second patterns P12~P142 via corresponding contacts (e.g., CON11 and CON12).

As indicated by FIG. 1, row adjacent page buffer high voltage transistors may be disposed at a spacing interval of 8F. For example, the first page buffer high voltage transistor PBHTR1 may be separated from the thirteenth page buffer high voltage transistor PBHTR13, which is row adjacent by a 8F interval. In comparison, referring to FIG. 2, row adjacent page buffer high voltage transistors must be separated by a spacing interval of 16F. See, e.g., the first page buffer high voltage transistor CPBHTR1 and a seventeenth page buffer high voltage transistor CPBHTR17 in FIG. 2.

In this manner, as compared with the conventional flash memory device 200 of FIG. 2, in the flash memory device 100 of FIG. 1, the spacing interval between row adjacent page buffer high voltage transistors is relatively small, therefore, the number of page buffer high voltage transistors disposed in the Y direction may be reduced (e.g., from 16 to 12).

As a result, a first pattern P131 and a second pattern P132 for the thirteenth page buffer high voltage transistor PBHTR13 adjacent to the first page buffer high voltage transistor PBHTR1 is connected to the thirteenth second voltage line B13 and the thirteenth first voltage line A13. On the other hand, in the conventional flash memory device 200 of FIG. 2, a first pattern CP171 and a second pattern CP172 for the seventeenth page buffer high voltage transistor CPBHTR17 adjacent to the first page buffer high voltage transistor CPBHTR1 is connected to a seventeenth first voltage line (not shown) and a seventeenth second voltage line (not shown).

Figure 3:
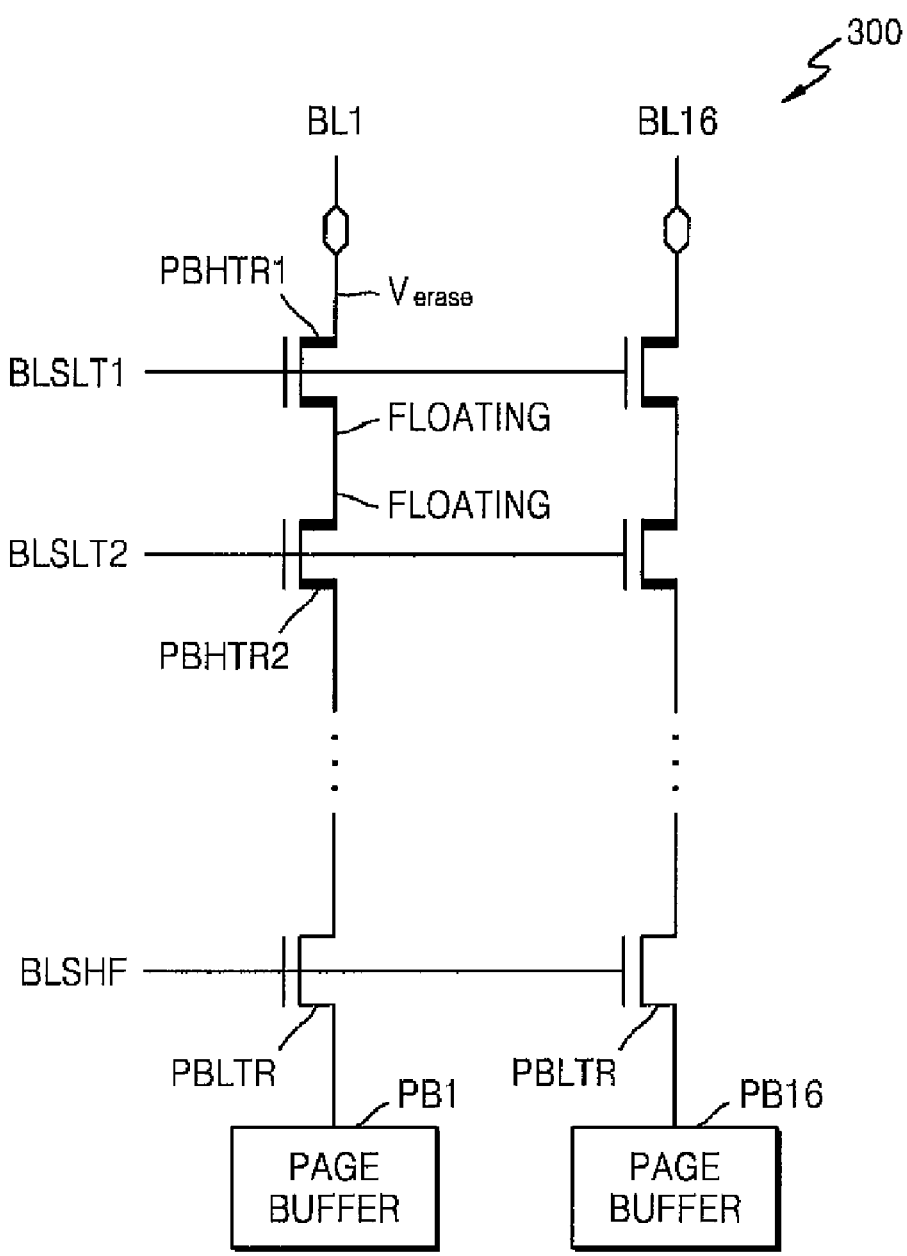
FIG. 3 is a partial circuit diagram for the flash memory device of FIG. 1.

FIG. 3 is a partial circuit diagram for the flash memory device 100 of FIG. 1.

Referring to FIGS. 1 and 3, the first through twelfth page buffer high voltage transistors PBHTR1~PBHTR12 may be serially connected in a columnar direction. The page buffer high voltage transistor (e.g., the first page buffer high voltage transistor PBHTR1) located at one end of this serial connection is connected to a bit line BL1. The page buffer high voltage transistor (not shown) located at an opposite second end of this serial connection is connected to a page buffer low voltage transistor PBLTR.

The first through twelfth page buffer high voltage transistors PBHTR1~PBHTR12 are respectively controlled by bit line selection signals BLSLT1~BLSLT12, and the page buffer low voltage transistors (e.g., PBLTR) are controlled by a control signal BLSHF. The page buffer low voltage transistors (e.g., PBLTR) are connected to page buffers PB1~PB16 in the illustrated example.

Figure 4:
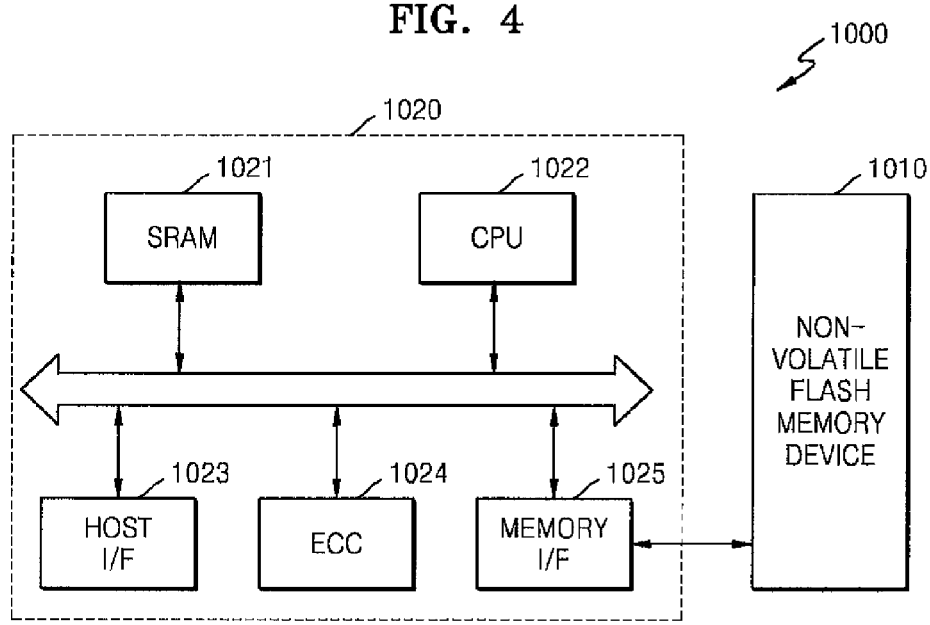
FIG. 4 is a block diagram of a memory card incorporating a flash memory device according to an embodiment of the inventive concept.

FIG. 4 is a block diagram of a memory card 1000 incorporating a flash memory device according to embodiment of the inventive concept.

Referring to FIG. 4, a flash memory device 1010 may be mounted on the memory card 1000 according to the present embodiment. The memory card 1000 may include a memory controller 1020 designed to control data exchange between a host and the flash memory device 1010.

A static random access memory (SRAM) 1021 is used as an operating memory of a central processing unit (CPU) 1022. A host interface (I/F) 1023 includes a data exchange protocol of the host that connects to the memory card 1000. An error correcting block (ECC) 1024 detects and corrects an error included in data read from the flash memory device 1010. A memory interface (I/F) 1025 interfaces with the flash memory device 1010. The CPU 1022 performs a control operation for the data exchange of the memory controller 1020. Although not illustrated in the drawings, the memory card 1000 according to the present embodiment may further include a read-only memory (ROM) (not shown) designed to store code data for interfacing the host.

The flash memory device 1010 and the memory card 1000 according to the present embodiment may be provided for a memory system such as a Solid State Disk (SSD).

Figure 5:
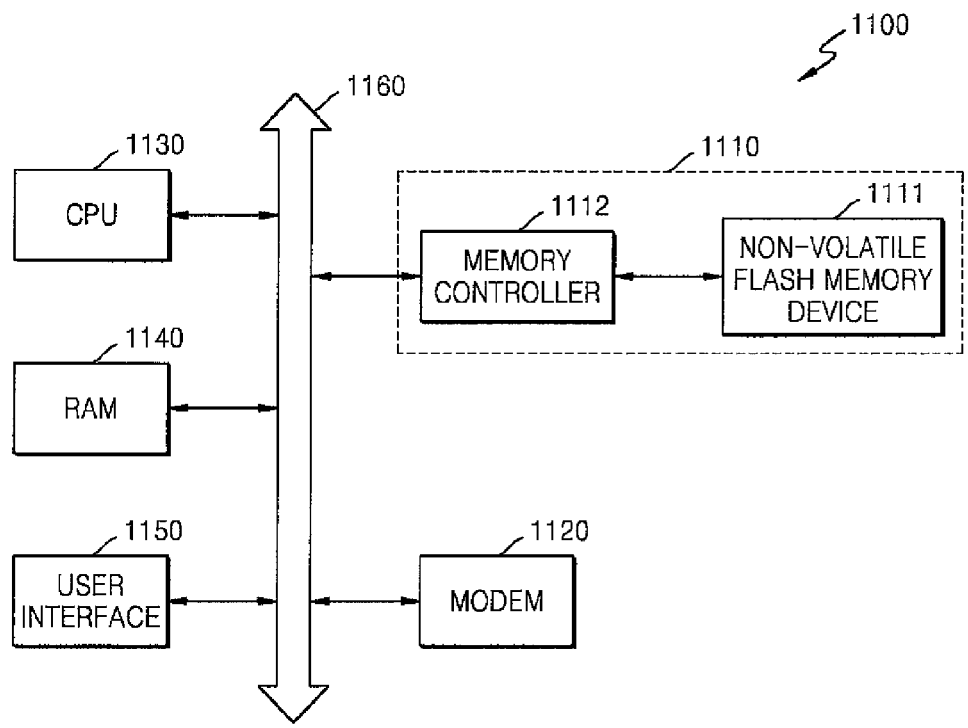
FIG. 5 is a block diagram of an information processing system incorporating a flash memory device according to an embodiment of the inventive concept.

FIG. 5 is a block diagram of an information processing system 1100 incorporating a flash memory device according to an embodiment of the inventive concept.

Referring to FIG. 5, the information processing system 1100 may include a flash memory device 1111. The flash memory device 1111 may be a part of a flash memory system 1110. The information processing system 1100 includes a modem 1120, a CPU 1130, a random-access memory (RAM) 1140 and a user interface 1150, which are respectively and electrically connected to the flash memory system 1110 via a system bus 1160. The flash memory system 1110 stores therein externally input data or data processed by the CPU 1130. Here, the flash memory system 1110 may be formed as a SSD, and in this case, the information processing system 1100 may stably store a large amount of data in the flash memory system 1110. According to increase of reliability, the flash memory system 1110 may reduce its resources used for error correction so that a rapid data exchanging function may be provided to the flash memory system 1110. Although not illustrated in the drawings, the information processing system 1100 according to the present embodiment may further include an application chipset, a camera image processor (CIS), a mobile dynamic random access memory (DRAM) and an input-output device.

The flash memory device according to the embodiments of the inventive concept may retain contained data even when a power supply is cut off. According to the increased use of mobile devices such as a cellular phone, a personal data assistant (PDA), a digital camera, a portable game console, and a MPEG-1 Audio Layer 3 (MP3) player, the flash memory device is widely used as a data storage and a code storage. Also, the flash memory device may be used for home applications including a High-definition television (HDTV), a Digital Versatile Disc (DVD), a router, and a global positioning system (GPS).

Also, the flash memory device may be mounted as packages having various types. For example, the flash memory device may be packaged according to various manners such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP), and then may be mounted.

An exemplary layout method for a flash memory device according to an embodiment of the inventive concept will now be described in relation to FIG. 1.

First, the positions on a semiconductor substrate for first through fourteenth page buffer high voltage transistors PBHTR1~PBHTR14 are defined. The first through fourteenth page buffer high voltage transistors PBHTR1 PBHTR14 respectively include gate patterns G1~G14, the first patterns P11~P141 floated when the erasing operation is performed, and the second patterns P12~P142 to which the erase voltage is applied when the erasing operation is performed.

Next, the second voltage lines B1~B16 are defined to be disposed in parallel, and the first voltage lines A1~A16 are defined to be disposed in parallel.

The first voltage lines A1~A16 and the second voltage lines B1~B16 may be connected to the first through fourteenth page buffer high voltage transistors PBHTR1~PBHTR14 via the contacts (e.g., CON11 and CON12).

The first pattern P11 of the first page buffer high voltage transistor PBHTR1 is disposed to be parallel and adjacent to the first pattern P21 of the second page buffer high voltage transistor PBHTR2. The second pattern P22 of the second page buffer high voltage transistor PBHTR2 is disposed to be parallel and adjacent to the second pattern P32 of the third page buffer high voltage transistor PBHTR3.

While the inventive concept has been particularly shown and described with reference to exemplary embodiments thereof, it will be understood that various changes in form and details may be made therein without departing from the scope of the following claims.

What is claimed is:

1. A flash memory device comprising:
a plurality of high voltage transistors operatively associated with a page buffer circuit, wherein each high voltage transistor comprises; a gate pattern separating a first pattern from a second pattern, wherein the first and second patterns extend in parallel and serve as respective source/drain regions, and the first pattern is floated and the second pattern receives an erase voltage during an erase operation, and
wherein a first set of high voltage transistors is series connected in a columnar arrangement, such that column adjacent high voltage transistors are laid out with alternating source/drain symmetry in the columnar direction.

2. The flash memory device of claim 1, wherein source/drain regions of the column adjacent high voltage transistors are separated by a spacing interval of three times a minimum feature size.

3. The flash memory device of claim 2, further comprising:
a second set of high voltage transistors series connected in the columnar arrangement and arranged in a row with the first set of high voltage transistors, such that row adjacent high voltage transistors are separated by a spacing interval of eight time the minimum feature size.

4. The flash memory device of claim 1, further comprising:
a plurality of first voltage lines disposed in parallel and extending in a columnar direction; and
a plurality of second voltage lines disposed in parallel and extending in the columnar direction;
wherein first patterns of the high voltage transistors in the first set of high voltage transistors are respectively connected to one of the plurality of first voltage lines and second patterns of the high voltage transistors in the first set of high voltage transistors are respectively connected to one of the plurality of second voltage lines.

5. The flash memory device of claim 4, wherein the plurality of first voltage lines and the plurality of second voltage lines vertically overlap as disposed at different material layers within the flash memory device.

6. The flash memory device of claim 5, wherein one end of the series connected first set of high voltage transistors is connected to a corresponding page buffer circuit through a low voltage transistor.

7. A layout method for a flash memory device, the method comprising:
defining a plurality of high voltage transistors operatively associated with a page buffer circuit, wherein each high voltage transistor comprises; a gate pattern separating a first pattern from a second pattern, wherein the first and second patterns extend in parallel and serve as respective source/drain regions;

defining a series connected first set of high voltage transistors in a columnar arrangement, such that column adjacent high voltage transistors are laid out with alternating source/drain symmetry in the columnar direction; and defining voltage line connections to the first set of high voltage transistors, such that during an erase operation each respective first pattern is floated and each respective second pattern receives an erase voltage.

8. The layout method of claim 7, wherein source/drain regions for the column adjacent high voltage transistors are defined as being separated by a spacing interval of three times a minimum feature size.

9. The layout method of claim 8, further comprising:

defining a second set of high voltage transistors series connected in the columnar arrangement and arranged in a row with the first set of high voltage transistors, such that row adjacent high voltage transistors are defined as being separated by a spacing interval of eight time the minimum feature size.

10. The layout method of claim 7, further comprising:

defining a plurality of first voltage lines disposed in parallel and extending in a columnar direction; and defining a plurality of second voltage lines disposed in parallel and extending in the columnar direction;

wherein first patterns of the high voltage transistors in the first set of high voltage transistors are respectively connected to one of the plurality of first voltage lines and second patterns of the high voltage transistors in the first set of high voltage transistors are respectively connected to one of the plurality of second voltage lines.

11. The layout method of claim 10, wherein the plurality of first voltage lines and the plurality of second voltage lines are defined to vertically overlap within the flash memory device.

12. The layout method of claim 11, wherein the first set of high voltage transistors is defined to connect to a corresponding page buffer circuit through a low voltage transistor.

* * * * *